(12) United States Patent
Nagano et al.

(10) Patent No.: US 9,425,224 B2
(45) Date of Patent: *Aug. 23, 2016

(54) LIGHT DETECTION DEVICE

(71) Applicant: HAMAMATSU PHOTONICS K.K., Hamamatsu-shi, Shizuoka (JP)

(72) Inventors: Terumasa Nagano, Hamamatsu (JP); Noburo Hosokawa, Hamamatsu (JP); Tomofumi Suzuki, Hamamatsu (JP); Takashi Baba, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 19 days.

This patent is subject to a terminal disclaimer.

(21) Appl. No.: 14/605,120

(22) Filed: Jan. 26, 2015

(65) Prior Publication Data

US 2015/0137298 A1 May 21, 2015

Related U.S. Application Data

(63) Continuation of application No. 14/352,398, filed as application No. PCT/JP2012/069728 on Aug. 2, 2012, now Pat. No. 8,969,990.

(30) Foreign Application Priority Data

Oct. 21, 2011 (JP) .................................. 2011-232104

(51) Int. Cl.
*H01L 27/144* (2006.01)
*H01L 31/107* (2006.01)
(Continued)

(52) U.S. Cl.
CPC ........ *H01L 27/1446* (2013.01); *H01L 27/1443* (2013.01); *H01L 27/14605* (2013.01); *H01L 31/02005* (2013.01); *H01L 31/02322* (2013.01); *H01L 31/107* (2013.01)

(58) Field of Classification Search
CPC .............. H01L 27/1446; H01L 31/107; H01L 31/02005; H01L 27/14605; H01L 27/1443; H01L 31/02322

See application file for complete search history.

(56) References Cited

U.S. PATENT DOCUMENTS 8,541,865 B2 9/2013 Yannou et al.
8,860,166 B2 10/2014 Sanfilippo et al.
(Continued)

FOREIGN PATENT DOCUMENTS

CN 1685513 10/2005
CN 101258577 9/2008
(Continued)

OTHER PUBLICATIONS

U.S. Office Action dated Sep. 17, 2015 that issued in U.S. Appl. No. 14/352,429 including Double Patenting Rejections on pp. 2-5.
(Continued)

*Primary Examiner* — Long Pham
(74) *Attorney, Agent, or Firm* — Drinker Biddle & Reath LLP

(57) ABSTRACT

A semiconductor light detection element has a plurality of channels, each of which consists of a photodiode array including a plurality of avalanche photodiodes operating in Geiger mode, quenching resistors connected in series to the respective avalanche photodiodes, and signal lines to which the quenching resistors are connected in parallel. A mounting substrate is configured so that a plurality of electrodes corresponding to the respective channels are arranged on a third principal surface side and so that a signal processing unit for processing output signals from the respective channels is arranged on a fourth principal surface side. In a semiconductor substrate, through-hole electrodes electrically connected to the signal lines are formed for the respective channels. The through-hole electrodes and the electrodes are electrically connected through bump electrodes.

8 Claims, 21 Drawing Sheets

(51) Int. Cl.
*H01L 31/02* (2006.01)
*H01L 27/146* (2006.01)
*H01L 31/0232* (2014.01)

(56) References Cited

U.S. PATENT DOCUMENTS

| | | | |
|---|---|---|---|
| 8,969,990 B2 * | 3/2015 | Nagano | H01L 27/1446 257/438 |
| 2013/0270666 A1 | 10/2013 | Sato et al. | |

FOREIGN PATENT DOCUMENTS

| | | |
|---|---|---|
| CN | 101379615 | 3/2009 |
| CN | 101484999 | 7/2009 |
| CN | 101488506 | 2/2011 |
| JP | 2001-291853 A | 10/2001 |
| JP | 2001-318155 A | 11/2001 |
| JP | 2004-165602 A | 6/2004 |
| JP | 2008-542706 | 11/2008 |
| JP | 2010-114199 A | 5/2010 |
| JP | 2010-535409 | 11/2010 |
| JP | 2010-536186 | 11/2010 |
| JP | 2011-003739 A | 1/2011 |
| JP | 5791461 | 10/2015 |
| TW | 201044619 | 12/2010 |
| TW | 201117406 | 5/2011 |
| WO | WO-2004/019411 A1 | 3/2004 |
| WO | WO-2008/004547 A1 | 1/2008 |

OTHER PUBLICATIONS

U.S. Office Action dated Sep. 18, 2015 that issued in U.S. Appl. No. 14/350,647 including Double Patenting Rejections on pp. 2-5.

English-language translation of International Preliminary Report on Patentability (IPRP) dated May 1, 2014 that issued in WO Patent Application No. PCT/JP2012/069730.

English-language translation of International Preliminary Report on Patentability (IPRP) dated May 22, 2014 that issued in WO Patent Application No. PCT/JP2012/069728.

* cited by examiner

LIGHT DETECTION DEVICE

This is a continuation application of copending application Ser. No. 14/352,398, having a §371 date of Apr. 17, 2014, which is a national stage filing based on PCT International Application No. PCT/JP2012/069728, filed on Aug. 2, 2012. The copending application Ser. No. 14/352,398 is incorporated by reference herein in its entirety.

TECHNICAL FIELD

The present invention relates to a light detection device.

BACKGROUND ART

There is a known photodiode array (semiconductor light detection element) having a plurality of avalanche photodiodes operating in Geiger mode and quenching resistors connected in series to the respective avalanche photodiodes (e.g., cf. Patent Literature 1). In this photodiode array, when an avalanche photodiode forming a pixel detects a photon to induce Geiger discharge, a pulsed signal is obtained by action of the quenching resistor connected to the avalanche photodiode. Each avalanche photodiode counts a photon. For this reason, with incidence of multiple photons at the same timing, we can also find out the number of incident photons in accordance with an output charge amount or signal intensity of all output pulses.

CITATION LIST

Patent Literature

Patent Literature 1: Japanese Patent Application Laid-Open Publication No. 2011-003739

SUMMARY OF INVENTION

Technical Problem

Some light detection devices are constructed using a semiconductor light detection element having multiple channels, each channel consisting of the aforementioned photodiode array, in order to meet the needs for implementation of larger area. In the case of the semiconductor light detection element having the multiple channels, distances of interconnections for guiding signals output from the respective channels (which will be referred to hereinafter as "interconnection distances") can be different among the channels. The different interconnection distances among the channels lead to different temporal resolutions among the channels due to influence of resistances and capacitances of the interconnections.

For equalizing the temporal resolutions among the channels, it is necessary to set the interconnection distances of the respective channels in accord with the channel having the longest interconnection distance. In this case, however, the interconnection distances of the respective channels become relatively longer, which limits improvement in temporal resolution.

It is an object of the present invention to provide a light detection device capable of achieving further improvement in temporal resolution, while offering a larger area.

Solution to Problem

The present invention provides a light detection device comprising: a semiconductor light detection element having a semiconductor substrate including first and second principal surfaces opposed to each other; and a mounting substrate arranged as opposed to the semiconductor light detection element and having a third principal surface opposed to the second principal surface of the semiconductor substrate and a fourth principal surface opposed to the third principal surface, wherein the semiconductor light detection element has a plurality of channels, each channel consisting of a photodiode array including a plurality of avalanche photodiodes operating in Geiger mode and formed in the semiconductor substrate, quenching resistors connected in series to the respective avalanche photodiodes and arranged on the first principal surface side of the semiconductor substrate, and signal lines to which the quenching resistors are connected in parallel and which are arranged on the first principal surface side of the semiconductor substrate, wherein the mounting substrate is configured so that a plurality of first electrodes corresponding to the respective channels are arranged on the third principal surface side and so that a signal processing unit electrically connected to the plurality of first electrodes and configured to process output signals from the respective channels is arranged on the fourth principal surface side, wherein in the semiconductor substrate, through-hole electrodes electrically connected to the signal lines and penetrating from the first principal surface side to the second principal surface side are formed for the respective channels, and wherein the through-hole electrodes and the first electrodes corresponding to the through-hole electrodes are electrically connected through bump electrodes.

In the present invention, the semiconductor light detection element has the plurality of channels, each channel consisting of the foregoing photodiode array. This configuration realizes the light detection device constructed in a larger area.

In the present invention, the through-hole electrodes electrically connected to the signal lines and penetrating from the first principal surface side to the second principal surface side are formed for the respective channels in the semiconductor substrate of the semiconductor light detection element, and the through-hole electrodes of the semiconductor light detection element and the first electrodes of the mounting substrate are electrically connected through the bump electrodes. This configuration allows the interconnection distances of the respective channels to be set extremely short and allows values thereof to be equalized without significant variation. Therefore, it remarkably suppresses the influence of resistances and capacitances of the interconnections and thus achieves improvement in temporal resolution.

In the present invention, the light detection device may further comprise a glass substrate arranged on the first principal surface side of the semiconductor substrate and having a fifth principal surface opposed to the first principal surface of the semiconductor substrate and a sixth principal surface opposed to the fifth principal surface, and a side surface of the semiconductor substrate and a side surface of the glass substrate may be flush with each other. In this case, the glass substrate enhances the mechanical strength of the semiconductor substrate. Since the side surface of the semiconductor substrate and the side surface of the glass substrate are flush with each other, this configuration reduces dead space.

In the present invention, the sixth principal surface of the glass substrate may be flat. In this case, it is extremely easy to perform installation of a scintillator onto the glass substrate.

In the present invention, the through-hole electrodes may be located in central regions of the respective channels. In this case, the interconnection distances from the avalanche photodiodes to the through-hole electrode are set short in each channel.

In the present invention, the through-hole electrodes may be located in regions between the channels. In this case, it is feasible to prevent reduction in fill factor in each channel.

In the present invention, the semiconductor light detection element may further include second electrodes arranged on the first principal surface side of the semiconductor substrate and connecting the signal lines and the through-hole electrodes. In this case, the signal lines and the through-hole electrodes are electrically connected with certainty.

Advantageous Effect of Invention

The present invention provides the light detection device capable of achieving further improvement in temporal resolution, while offering a larger area.

DESCRIPTION OF EMBODIMENTS

The preferred embodiments of the present invention will be described below in detail with reference to the accompanying drawings. In the description the same elements or elements with the same functionality will be denoted by the same reference signs, without redundant description.

Figure 1:
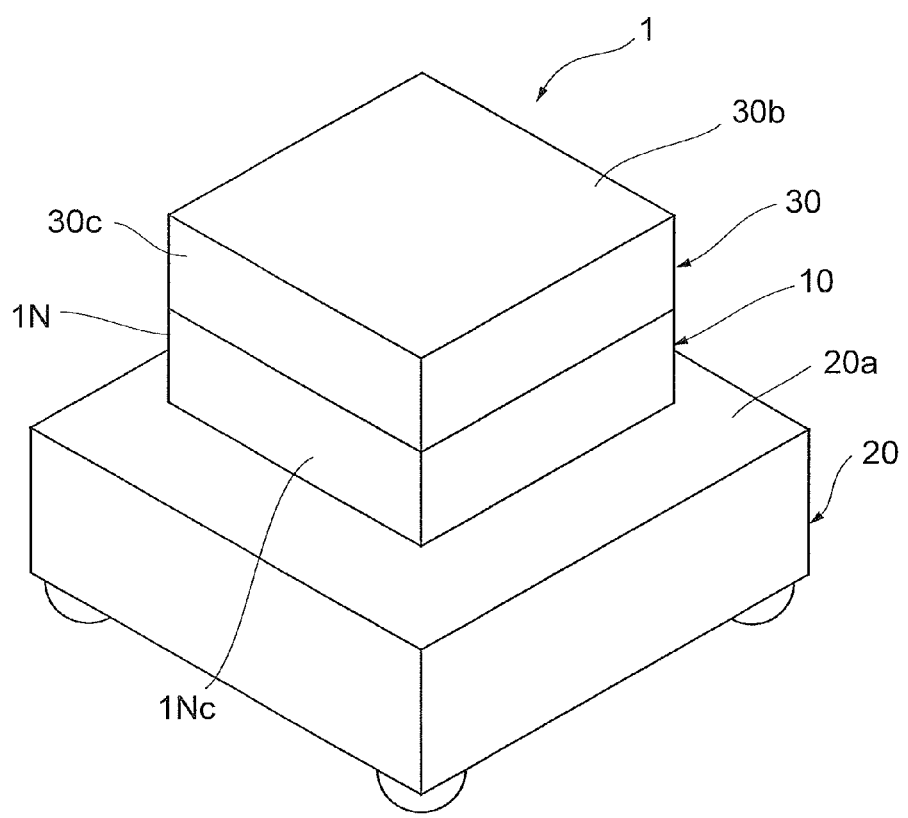
FIG. 1 is a schematic perspective view showing a light detection device according to an embodiment of the present invention.
Figure 2:
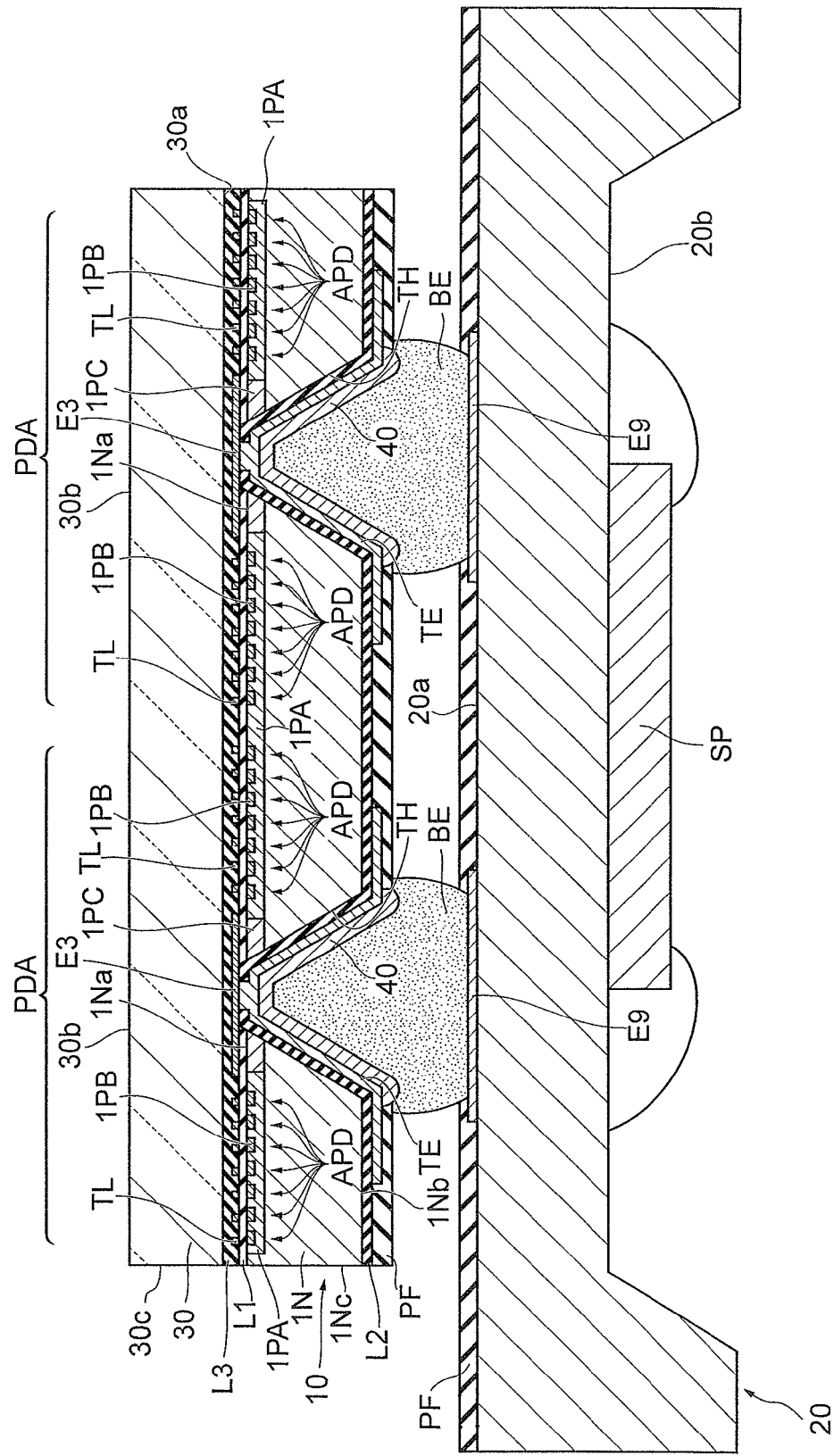
FIG. 2 is a drawing for explaining a sectional configuration of the light detection device according to the present embodiment.
Figure 3:
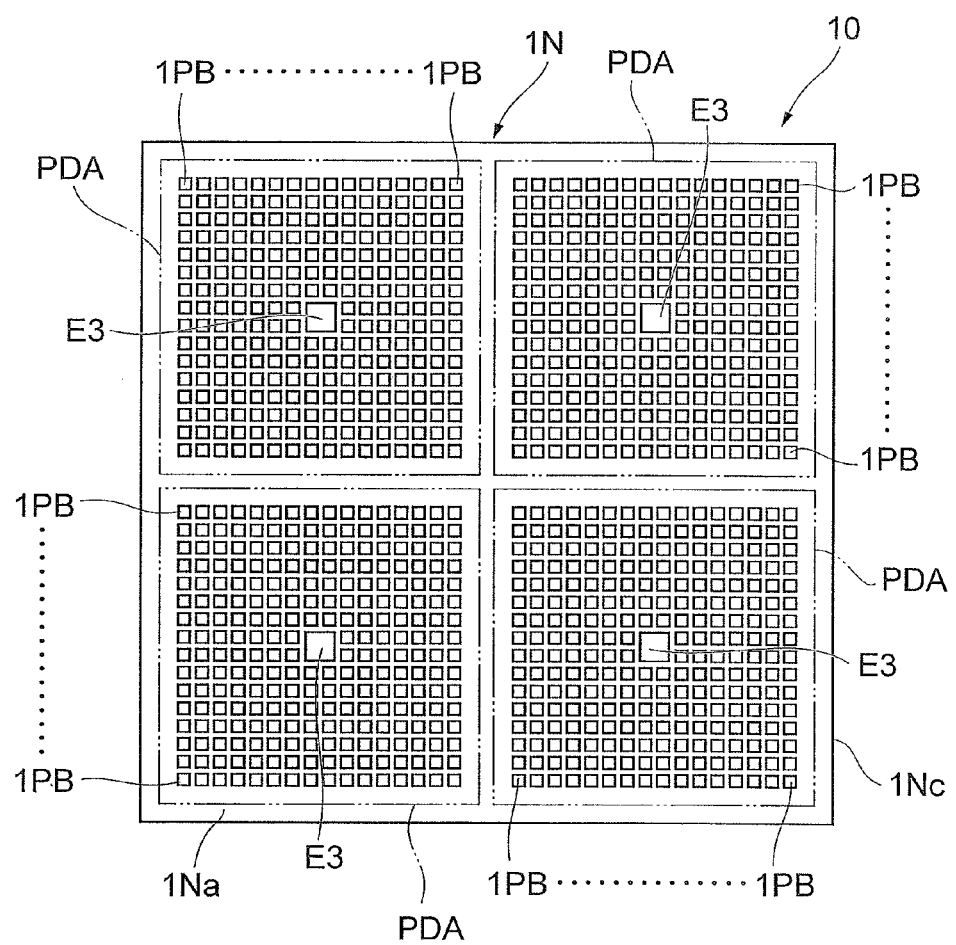
FIG. 3 is a schematic plan view of a semiconductor light detection element.
Figure 4:
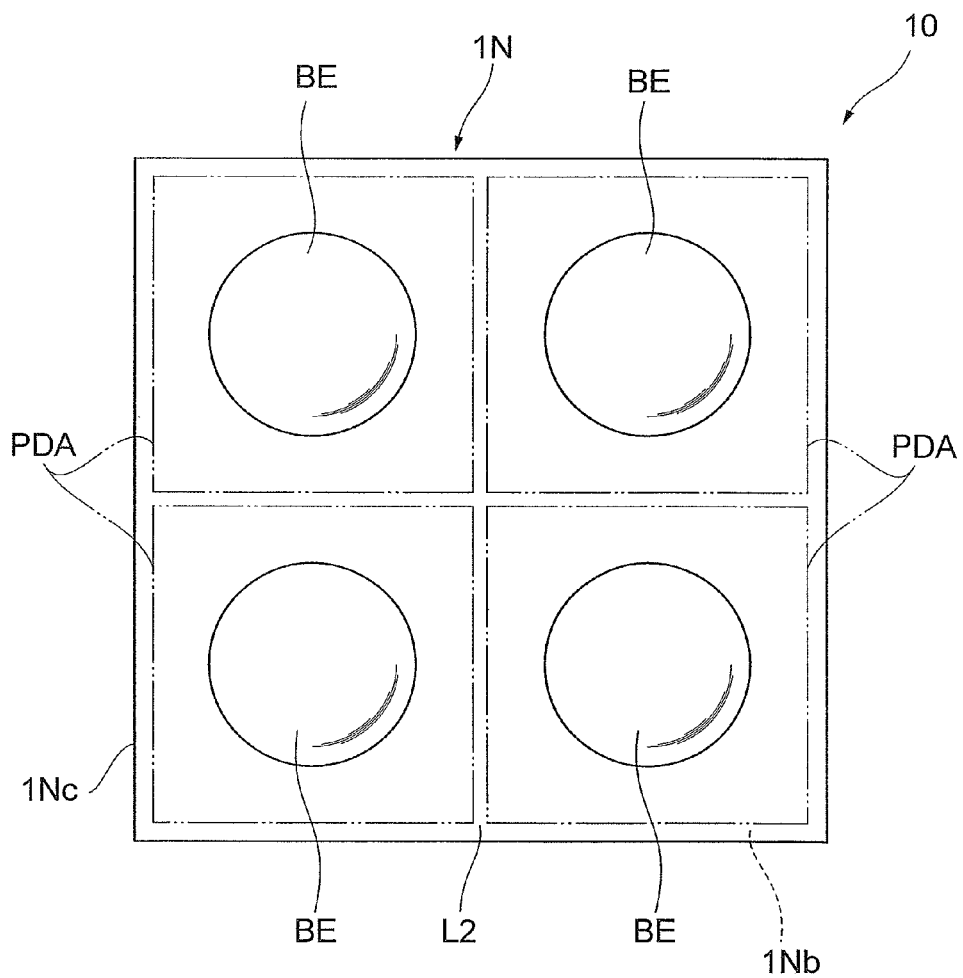
FIG. 4 is a schematic plan view of the semiconductor light detection element.
Figure 5:
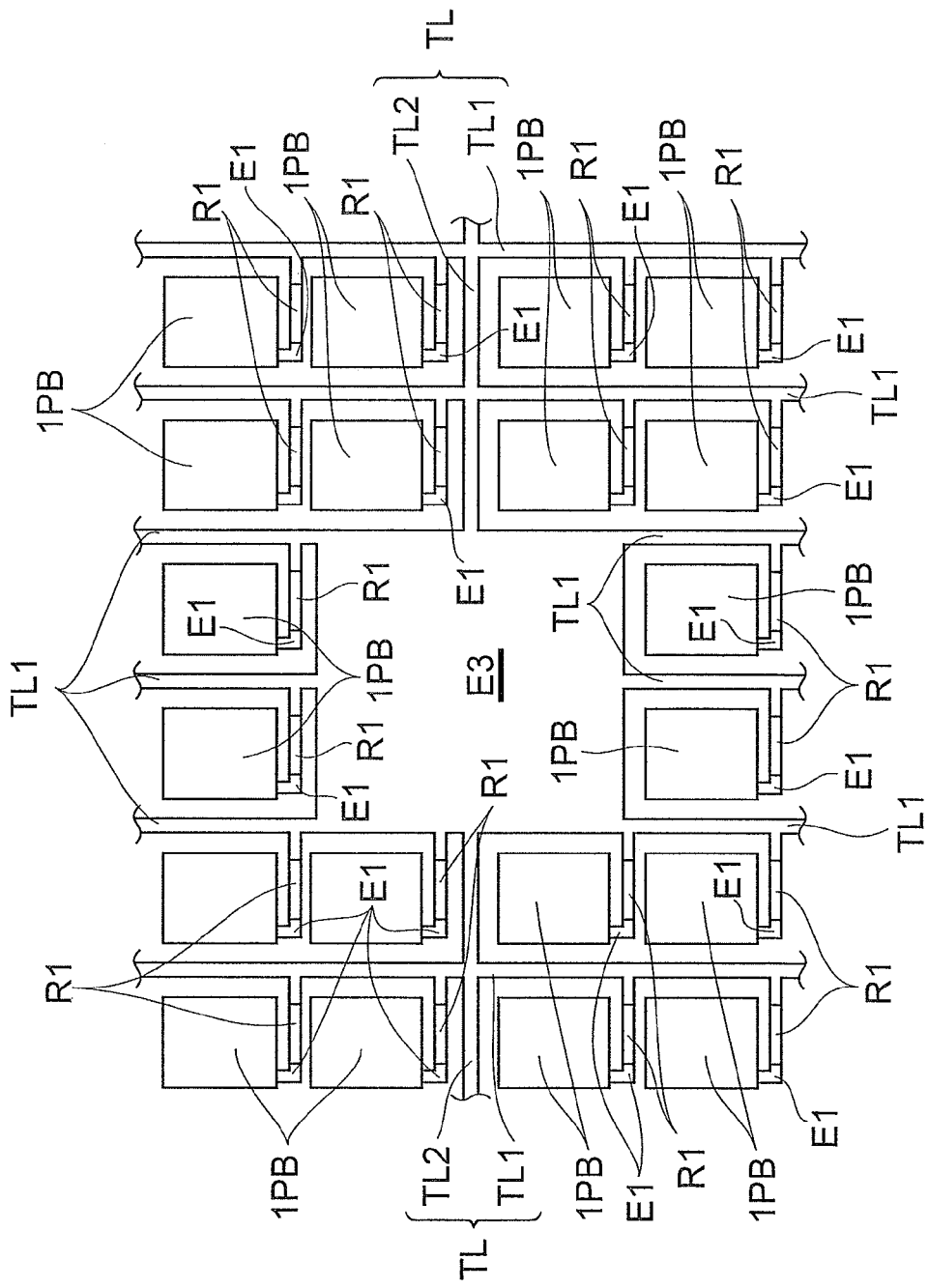
FIG. 5 is a schematic plan view of a photodiode array.
Figure 6:
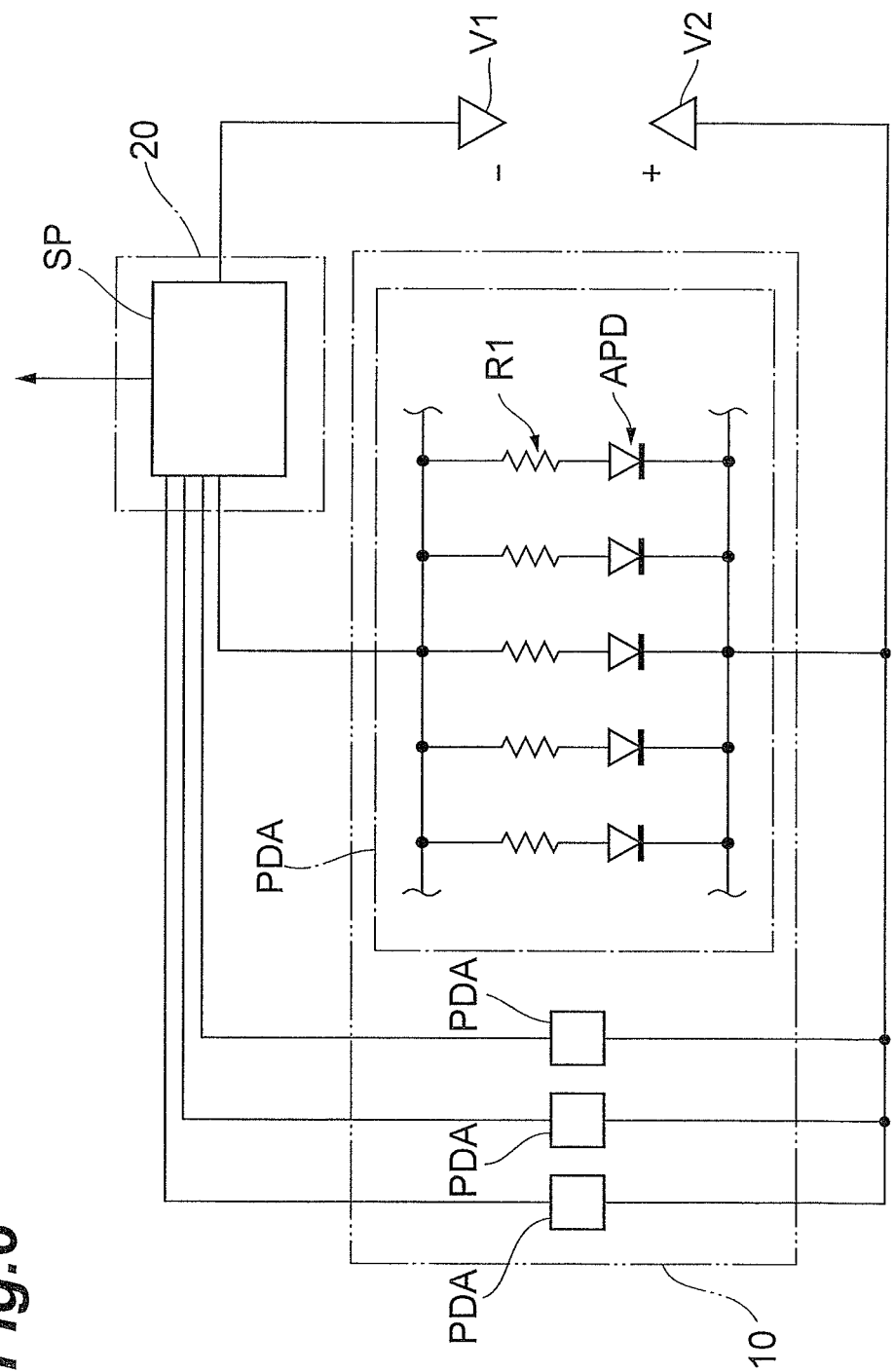
FIG. 6 is a circuit diagram of the light detection device.
Figure 7:
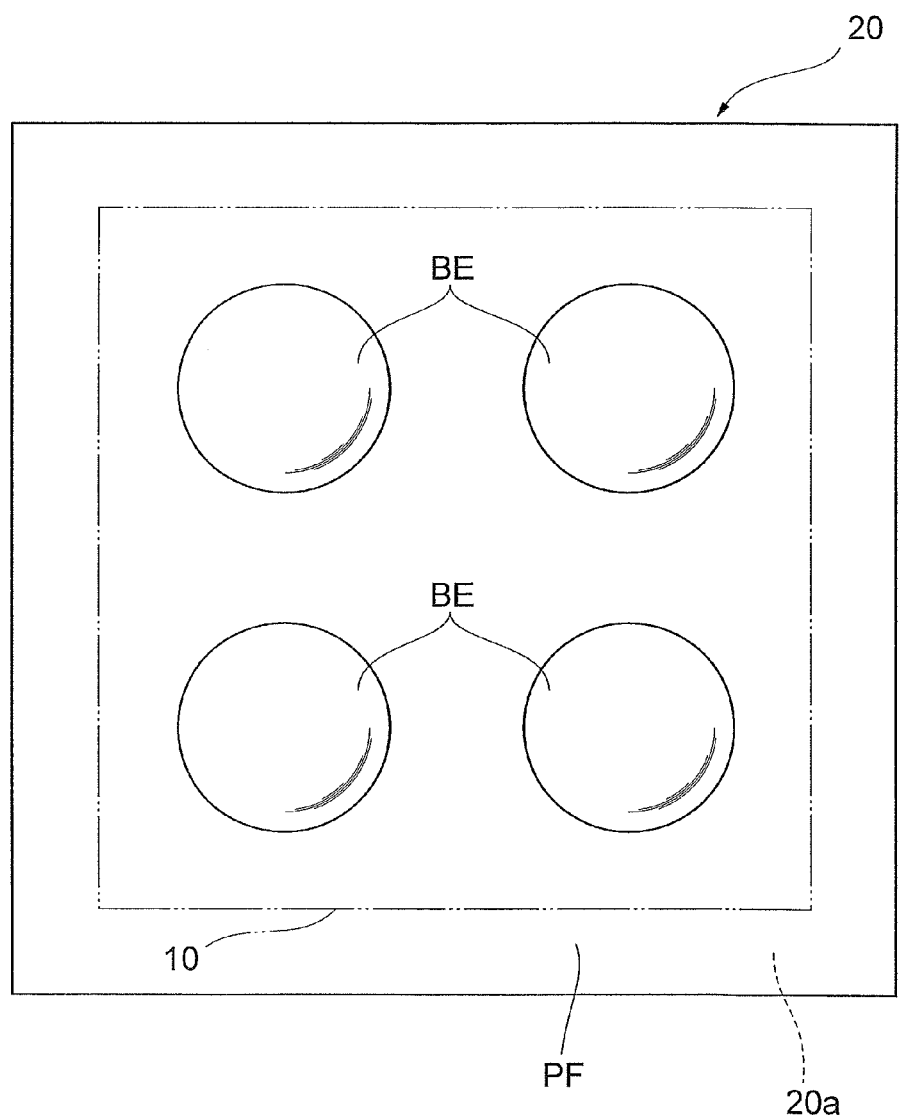
FIG. 7 is a schematic plan view of a mounting substrate.

A configuration of the light detection device 1 according to the present embodiment will be described with reference to FIGS. 1 to 7. FIG. 1 is a schematic perspective view showing the light detection device according to the present embodiment. FIG. 2 is a drawing for explaining a sectional configuration of the light detection device according to the present embodiment. FIGS. 3 and 4 are schematic plan views of a semiconductor light detection element. FIG. 5 is a schematic plan view of a photodiode array. FIG. 6 is a circuit diagram of the light detection device. FIG. 7 is a schematic plan view of a mounting substrate.

The light detection device 1, as shown in FIGS. 1 and 2, has a semiconductor light detection element 10, a mounting substrate 20, and a glass substrate 30. The mounting substrate 20 is arranged as opposed to the semiconductor light detection element 10. The glass substrate 30 is arranged as opposed to the semiconductor light detection element 10. The semiconductor light detection element 10 is arranged between the mounting substrate 20 and the glass substrate 30.

The semiconductor light detection element 10, as also shown in FIG. 3, has a plurality of channels each of which consists of one photodiode array PDA; i.e., it has a plurality of photodiode arrays PDA. The semiconductor light detection element 10 has a semiconductor substrate 1N of a rectangular shape on the plan view. The semiconductor substrate 1N includes a principal surface 1Na and a principal surface 1Nb opposed to each other. The semiconductor substrate 1N is an N-type (first conductivity type) semiconductor substrate comprised of Si.

Each photodiode array PDA includes a plurality of avalanche photodiodes APD formed in the semiconductor substrate 1N. Connected in series to each avalanche photodiode APD, as also shown in FIG. 5, is a quenching resistor R1. One avalanche photodiode APD constitutes one pixel in each photodiode array PDA. While each avalanche photodiode APD is connected in series to the corresponding quenching resistor R1, all the avalanche photodiodes are connected in parallel and a reverse bias voltage is applied thereto from a power supply. Output currents from the avalanche photodiodes APD are detected by a below-described signal processing unit SP.

Each individual avalanche photodiode APD has a P-type (second conductivity type) first semiconductor region 1PA and a P-type (second conductivity type) second semiconductor region 1PB. The first semiconductor region 1PA is formed on the principal surface 1Na side of the semiconductor substrate 1N. The second semiconductor region 1PB is formed in the first semiconductor region 1PA and has a higher impurity concentration than the first semiconductor region 1PA. The planar shape of the second semiconductor region 1PB is, for example, a polygonal shape (square in the present embodiment). The depth of the first semiconductor region 1PA is larger than that of the second semiconductor region 1PB.

The semiconductor substrate 1N has N-type (first conductivity type) semiconductor regions 1PC. The semiconductor regions 1PC are formed on the principal surface 1Na side of the semiconductor substrate 1N. The semiconductor regions 1PC prevent PN junctions formed between the N-type semiconductor substrate 1N and the P-type first semiconductor regions 1PA from being exposed to through holes TH in which below-described through-hole electrodes TE are arranged. The semiconductor regions 1PC are formed at positions corresponding to the through holes TH (through-hole electrodes TE).

Each avalanche photodiode APD, as shown in FIG. 5, has an electrode E1. Each electrode E1 is arranged on the principal surface 1Na side of the semiconductor substrate 1N. The electrode E1 is electrically connected to the second semiconductor region 1PB. Each avalanche photodiode APD has an electrode (not shown) electrically connected to the semiconductor substrate 1N. This electrode is arranged each on the principal surface 1Nb side of the semiconductor substrate 1N. The first semiconductor region 1PA is electrically connected through the second semiconductor region 1PB to the electrode E1.

The photodiode array PDA, as shown in FIG. 5, has signal lines TL and an electrode E3 arranged through an insulating layer L1 on the semiconductor substrate 1N outside the second semiconductor regions 1PB. The signal lines TL and electrode E3 are arranged on the principal surface 1Na side of the semiconductor substrate 1N. The electrode E3 is located in a central region of each channel (photodiode array PDA).

The signal lines TL include a plurality of signal lines TL1 and a plurality of signal lines TL2. Each signal line TL1 extends in a Y-axis direction between adjacent avalanche photodiodes APD on the plan view. Each signal line TL2 extends in an X-axis direction between adjacent avalanche photodiodes APD and electrically connects a plurality of signal lines TL1 to each other. The signal lines TL2 are connected to the electrode E3. The signal lines TL1 are electrically connected through the signal lines TL2 to the electrode E3, except for those directly connected to the electrode E3.

The photodiode array PDA has the quenching resistors R1 for the respective individual avalanche photodiodes APD. Each quenching resistor R1 is arranged through the insulating layer L1 on the semiconductor substrate 1N outside the second semiconductor region 1PB. The quenching resistor R1 is arranged on the principal surface 1Na side of the semiconductor substrate 1N. The quenching resistor R1 has one end connected to the electrode E1 and the other end connected to the signal line TL1. FIGS. 3 and 5 are drawn without illustration of the insulating layers L1, L3 shown in FIG. 2, for clarity of structure.

Each avalanche photodiode APD (a region immediately below the first semiconductor region 1PA) is connected through the quenching resistor R1 to the signal line TL1. A plurality of avalanche photodiodes APD are connected through the respective quenching resistors R1 to one signal line TL1.

The insulating layer L3 is arranged on the principal surface 1Na side of the semiconductor substrate 1N. The insulating layer L3 is formed so as to cover the electrodes E1, E3, quenching resistors R1, and signal lines TL.

Each photodiode array PDA includes a through-hole electrode TE. The through-hole electrodes are provided for the respective individual photodiode arrays PDA, i.e., for the respective individual channels. The through-hole electrodes TE are formed so as to penetrate the semiconductor substrate 1N from the principal surface 1Na side to the principal surface 1Nb side. The through-hole electrodes TE are arranged in the through holes TH penetrating the semiconductor substrate 1N. An insulating layer L2 is also formed in the through holes TH. Therefore, the through-hole electrodes TE are arranged through the insulating layer L2 in the through holes TH.

The through-hole electrode TE has one end connected to the electrode E3. The electrode E3 connects the signal lines TL and the through-hole electrode TE. The quenching resistors R1 are electrically connected through the signal lines TL and the electrode E3 to the through-hole electrode TE.

The quenching resistors R1 have the resistivity higher than that of the electrodes E1 to which the quenching resistors R1 are connected. The quenching resistors R1 are comprised, for example, of polysilicon. An applicable method for forming the quenching resistors R1 is a CVD (Chemical Vapor Deposition) process.

The electrodes E1, E3 and the through-hole electrodes TE are comprised of metal such as aluminum. When the semiconductor substrate is made of Si, a frequently used electrode material is AuGe/Ni, as well as aluminum. An applicable method for forming the electrodes E1, E3 and the through-hole electrodes TE is a sputtering process.

A P-type impurity to be used in the case using Si is a group 3 element such as B and an N-type impurity to be used in the same case is a group 5 element such as N, P, or As. If the semiconductor light detection element is constructed by interchanging the N type and P type of semiconductor conductivity types with each other, the element can also function well. An applicable method for adding these impurities is a diffusion process or an ion implantation process.

A material available for the insulating layers L1, L2, L3 is $SiO_2$ or SiN. An applicable method for forming the insulating layers L1, L2, L3 in the case of the insulating layers L1, L2, L3 being made of $SiO_2$ is a thermal oxidation process or a sputtering process.

In the case of the above-described structure, the PN junctions are formed between the N-type semiconductor substrate 1N and the P-type first semiconductor regions 1PA, thereby forming the avalanche photodiodes APD. The semiconductor substrate 1N is electrically connected to the electrode (not shown) formed on the back surface of the substrate 1N and the first semiconductor regions 1PA are connected through the second semiconductor regions 1PB to the electrodes E1. The quenching resistor R1 is connected in series to the avalanche photodiode APD (cf. FIG. 6).

In the photodiode array PDA, the individual avalanche photodiodes APD are made to operate in Geiger mode. In Geiger mode, a backward voltage (reverse bias voltage) larger than the breakdown voltage of the avalanche photodiodes APD is applied between anodes and cathodes of the avalanche photodiodes APD. A (−) potential V1 is applied to the anodes and a (+) potential V2 to the cathodes. The polarities of these potentials are relative ones, one of which can be the ground potential.

The anodes are the P-type first semiconductor regions 1PA while the cathodes are the N-type semiconductor substrate 1N. When light (photon) is incident into the avalanche photodiode APD, photoelectric conversion is effected inside the substrate to generate photoelectrons. Avalanche multiplication is effected in a region around the PN junction interface of the first semiconductor region 1PA and a group of multiplied electrons flow toward the electrode formed on the back surface of the semiconductor substrate 1N. Namely, with incidence of light (photon) into one pixel (avalanche photodiode APD) in the photodiode array PDA, it is subjected to multiplication to be taken out as signal from the electrode E3 (through-hole electrode TE).

The other ends of the quenching resistors R1 connected to the individual avalanche photodiodes APD are electrically connected to common signal lines TL along the front surface of the semiconductor substrate 1N. The plurality of avalanche photodiodes APD operate in Geiger mode and each avalanche photodiode APD is connected to the common signal line TL. For this reason, when photons are simultaneously incident into a plurality of avalanche photodiodes APD, outputs from the plurality of avalanche photodiodes APD are fed all to the common signal lines TL and as a whole, they are measured as a signal with a high intensity according to the number of incident photons. Then, in the semiconductor light detection element 10, signals are output through the corresponding through-hole electrodes TE, in the respective channels (photodiode arrays PDA).

The mounting substrate 20, as also shown in FIG. 2, has a principal surface 20a and a principal surface 20b opposed to each other. The mounting substrate 20 has a rectangular shape on the plan view. The principal surface 20a is opposed to the principal surface 1Nb of the semiconductor substrate 1N. The mounting substrate 20 includes a plurality of electrodes E9 arranged on the principal surface 20a side. The electrodes E9 are arranged corresponding to the through-hole electrodes TE, as shown in FIGS. 2 and 7. Namely, the electrodes E9 are arranged on respective regions opposed to the through-hole electrodes TE, on the principal surface 20a. The electrodes E9 are provided corresponding to the respective channels (photodiode arrays PDA). FIG. 2 is drawn without illustration of bump electrodes described on the principal surface 20b side of the mounting substrate 20.

The through-hole electrodes TE and the electrodes E9 are connected through bump electrodes BE. This makes the electrodes E3 electrically connected through the through-hole electrodes TE and the bump electrodes BE to the electrodes E9. Then, the quenching resistors R1 are electrically connected to the electrodes E9 through the single lines TL, electrodes E3, through-hole electrodes TE, and bump electrodes BE. The electrodes E9 are also comprised of metal such as aluminum as the electrodes E1, E3 and the through-hole electrodes TE are. The electrode material to be used may be, for example, AuGe/Ni, as well as aluminum. The bump electrodes BE are comprised, for example, of solder. The bump electrodes BE are formed through UBM (Under Bump Metal) 40 on the through-hole electrodes TE.

The mounting substrate 20 has a signal processing unit SP. The signal processing unit SP is arranged on the principal surface 20b side of the mounting substrate 20. The signal processing unit SP constitutes ASIC (Application Specific Integrated Circuit). Each electrode E9 is electrically connected to the signal processing unit SP through an interconnection (not shown) formed in the mounting substrate 20 and through a bonding wire. The output signals from the respective channels (photodiode arrays PDA) are fed to the signal processing unit SP and then the signal processing unit SP processes the output signals from the respective channels. The signal processing unit SP includes a CMOS circuit to convert the output signals from the respective channels into digital pulses.

Passivation films PF with openings formed at the positions corresponding to the bump electrodes BE are arranged on the principal surface 1Nb side of the semiconductor substrate 1N and on the principal surface 20a side of the mounting substrate 20. The passivation films PF are comprised, for example, of SiN. An applicable method for forming the passivation films PF is a CVD process.

The glass substrate 30 has a principal surface 30a and a principal surface 30b opposed to each other. The glass substrate 30 has a rectangular shape on the plan view. The principal surface 30a is opposed to the principal surface 1Nb of the semiconductor substrate 1N. The principal surface 30b is flat. In the present embodiment, the principal surface 30a is also flat. The glass substrate 30 and the semiconductor light detection element 10 are optically connected to each other with an optical adhesive (not shown). The glass substrate 30 may be directly formed on the semiconductor light detection element 10.

Although illustration is omitted, a scintillator is optically connected to the principal surface 30b of the glass substrate 30 with an optical adhesive. Scintillation light from the scintillator passes through the glass substrate 30 to enter the semiconductor light detection element 10.

The side surfaces 1Nc of the semiconductor substrate 1N and the side surfaces 30c of the glass substrate 30 are flush with each other, as also shown in FIG. 1. On the plan view, the outer edge of the semiconductor substrate 1N and the outer edge of the glass substrate 30 are coincident.

Next, a manufacturing process of the above-described light detection device 1 will be described with reference to FIGS. 8 to 17. FIGS. 8 to 17 are drawings for explaining the manufacturing process of the light detection device according to the present embodiment.

Figure 8:
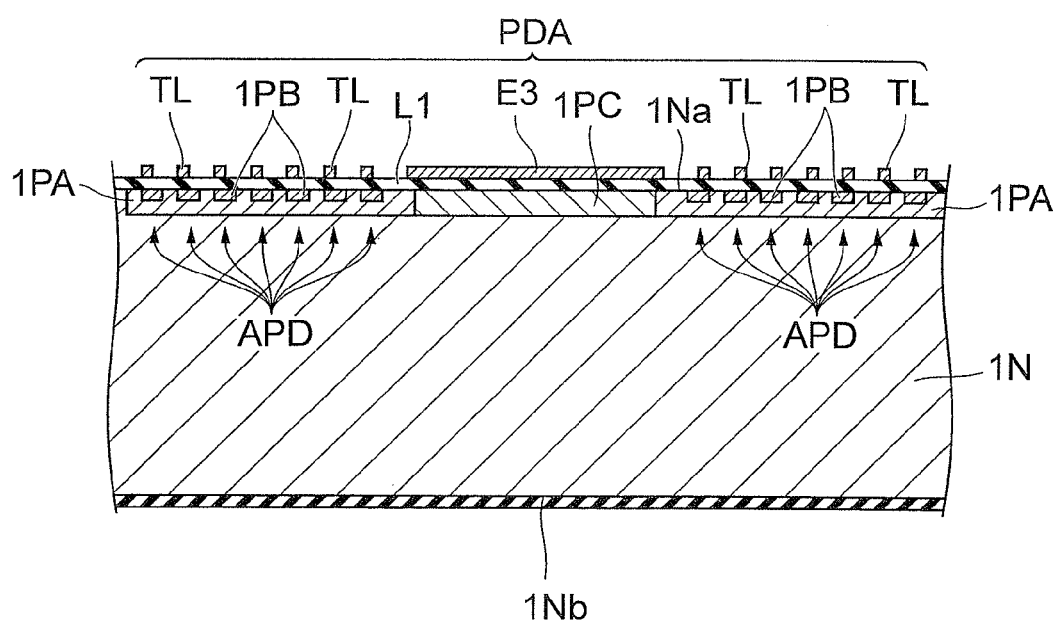
FIG. 8 is a drawing for explaining a manufacturing process of the light detection device according to the present embodiment.

First, the semiconductor substrate 1N in which the portions corresponding to the semiconductor light detection element 10, i.e., the portions (first semiconductor regions 1PA, second semiconductor regions 1PB, insulating layer L1, quenching resistors R1, electrodes E1, E3, and signal lines TL) corresponding to the channels (photodiode arrays PDA) are formed is prepared (cf. FIG. 8). The semiconductor substrate 1N is prepared in the form of a semiconductor wafer wherein there are a plurality of portions corresponding to semiconductor light detection elements 10 formed.

Figure 9:
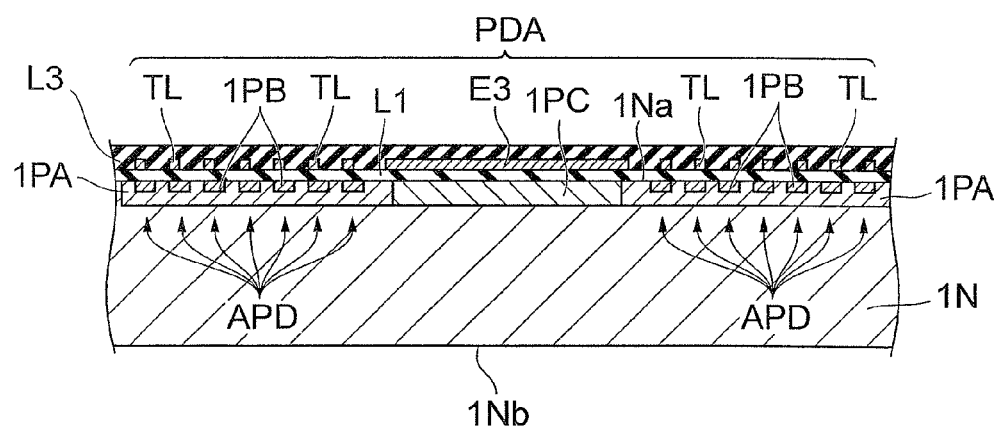
FIG. 9 is a drawing for explaining the manufacturing process of the light detection device according to the present embodiment.

Next, the insulating layer L3 is formed on the principal surface 1Na side of the prepared semiconductor substrate 1N, and then the semiconductor substrate 1N is thinned from the principal surface 1Nb side (cf. FIG. 9). The insulating layer L3 is comprised of $SiO_2$. An applicable method for forming the insulating layer L3 is a CVD process. An applicable method for thinning the semiconductor substrate 1N is a mechanical polishing process or a chemical polishing process.

Figure 10:
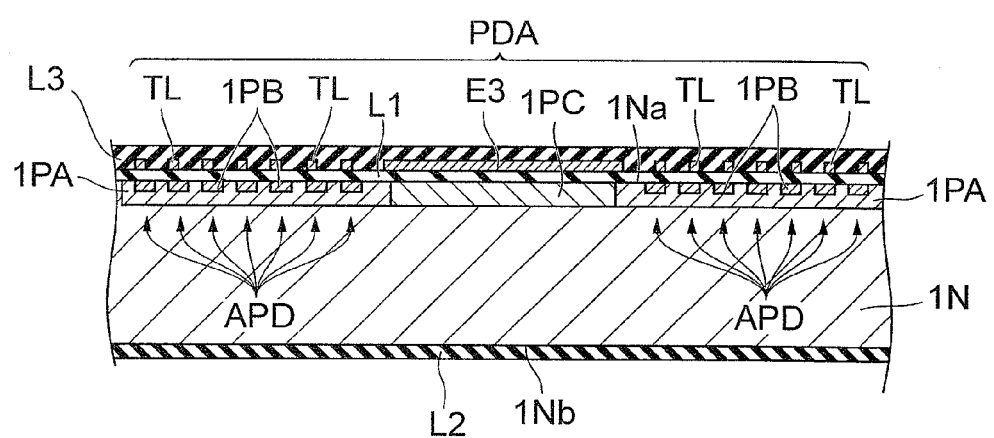
FIG. 10 is a drawing for explaining the manufacturing process of the light detection device according to the present embodiment.

Next, the insulating layer L2 is formed on the principal surface 1Nb side of the prepared semiconductor substrate 1N (cf. FIG. 10). The insulating layer L2 is comprised of $SiO_2$. An applicable method for forming the insulating layer L2 is a CVD process.

Figure 11:
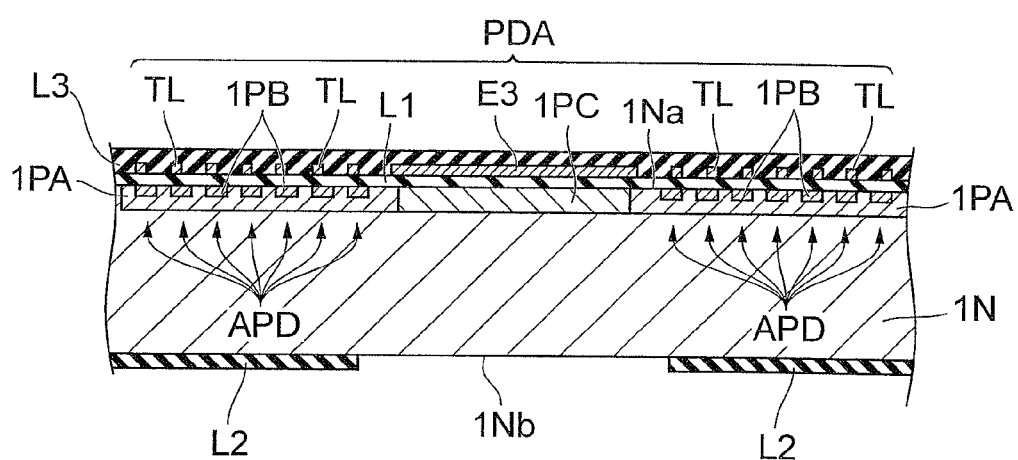
FIG. 11 is a drawing for explaining the manufacturing process of the light detection device according to the present embodiment.

Next, regions where the through holes TH are to be formed, in the insulating layer L2, are removed (cf. FIG. 11). An applicable method for removing the insulating layer L2 is a dry etching process.

Figure 12:
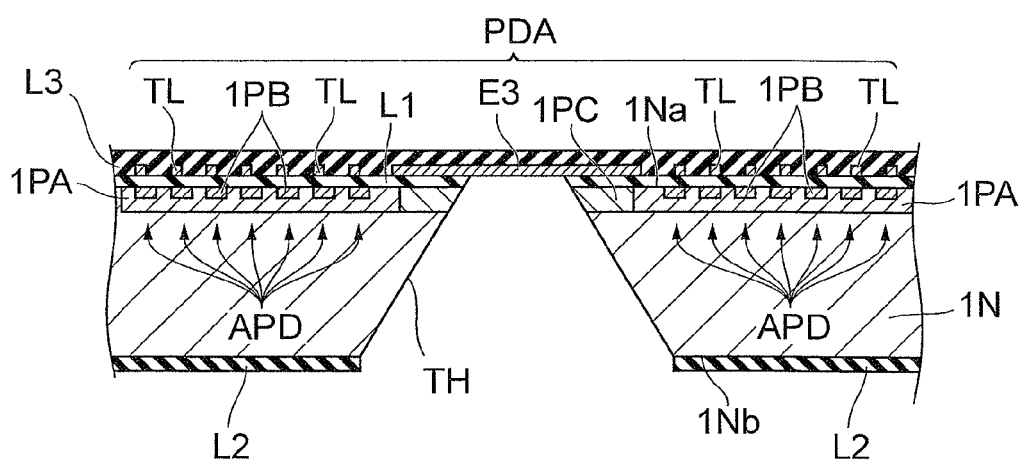
FIG. 12 is a drawing for explaining the manufacturing process of the light detection device according to the present embodiment.

Next, the through holes TH for arranging the through-hole electrodes TE are formed on the semiconductor substrate 1N (cf. FIG. 12). An applicable method for forming the through holes TH is one suitably selected from a dry etching process and a wet etching process. When an alkali etching process is used as the wet etching process, the insulating layer L1 functions as an etching stop layer.

Figure 13:
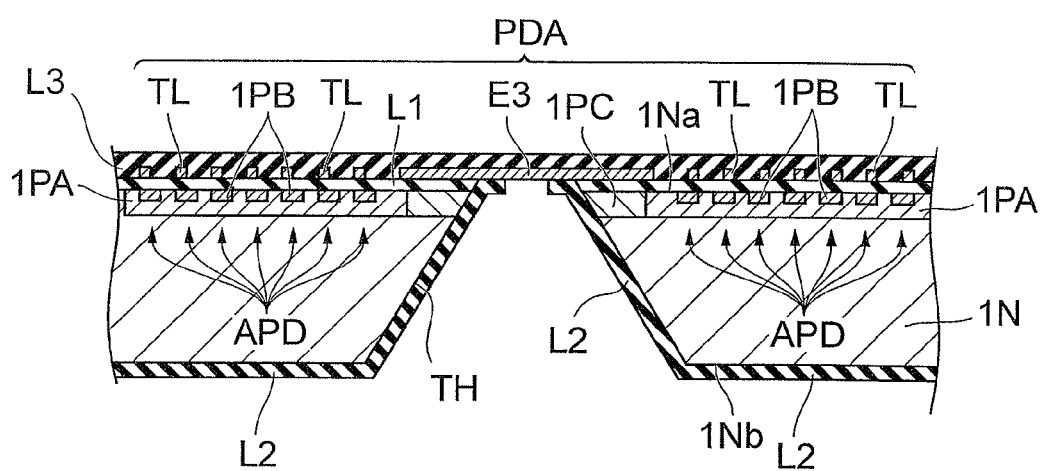
FIG. 13 is a drawing for explaining the manufacturing process of the light detection device according to the present embodiment.

Next, the insulating layer L2 is formed on the principal surface 1Nb side of the prepared semiconductor substrate 1N again, and then parts of the insulating layer L1 and the insulating layer L2 are removed in order to expose the electrodes E3 (cf. FIG. 13). An applicable method for removing the insulating layer L1 and the insulating layer L2 is a dry etching process.

Figure 14:
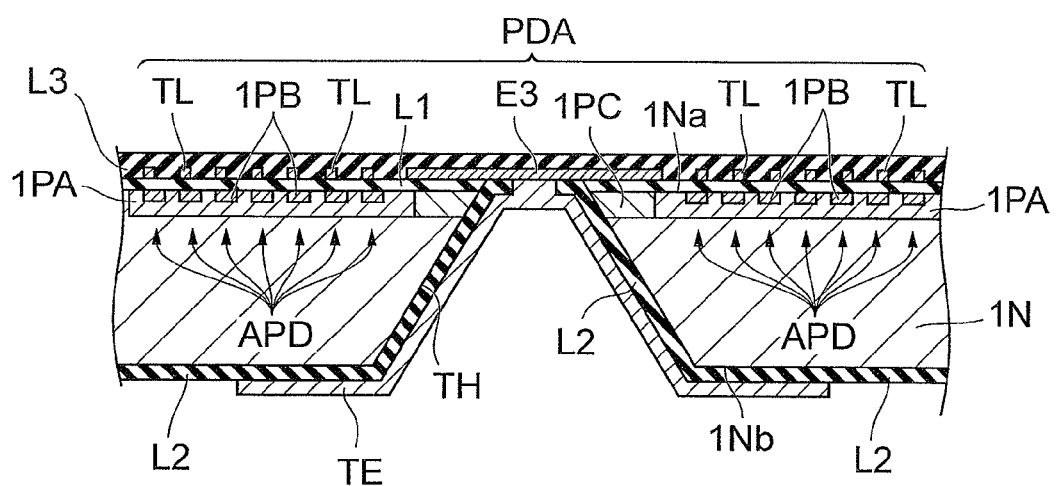
FIG. 14 is a drawing for explaining the manufacturing process of the light detection device according to the present embodiment.

Next, the through-hole electrodes TE are formed (cf. FIG. 14). An applicable method for forming the through-hole electrodes TE is a sputtering process, as described above.

Figure 15:
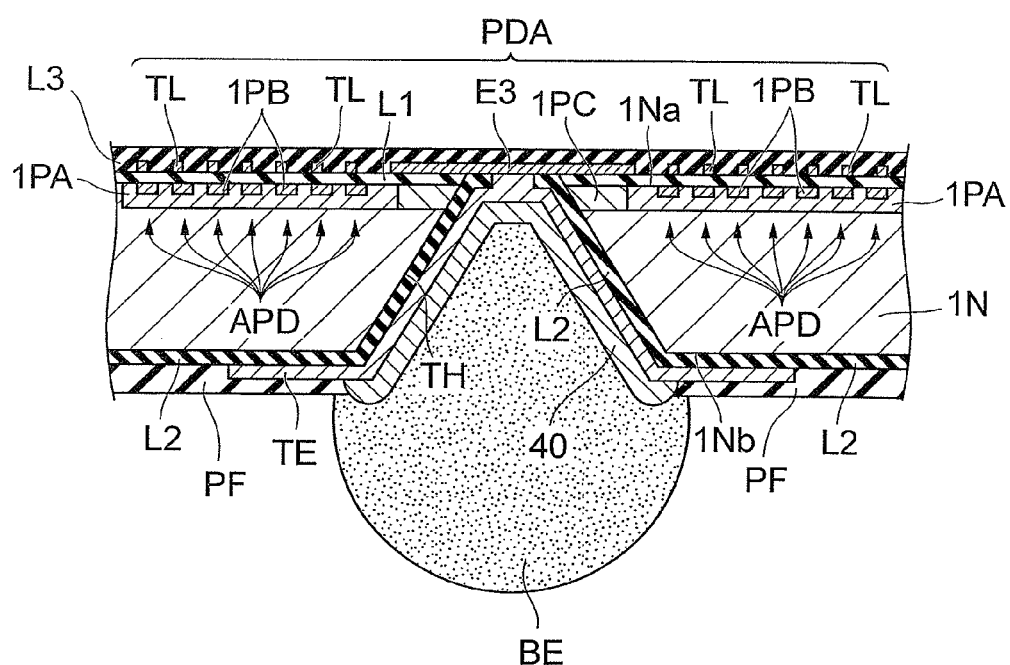
FIG. 15 is a drawing for explaining the manufacturing process of the light detection device according to the present embodiment.

Next, the passivation film PF with the openings formed at the positions corresponding to the bump electrodes BE is formed on the principal surface 1Nb side of the semiconductor substrate 1N, and then the bump electrodes BE are formed (cf. FIG. 15). This process completes the semiconductor light detection element 10. Prior to the formation of the bump electrodes BE, UBM 40 is formed in the regions exposed from the passivation film PF on the through-hole electrodes TE. The UBM 40 is comprised of a material that achieves superior electrical and physical connection with the bump electrodes BE. An applicable method for forming the UBM 40 is an electroless plating process. An applicable method for forming the bump electrodes BE is a technique for mounting solder balls or a printing process.

Figure 16:
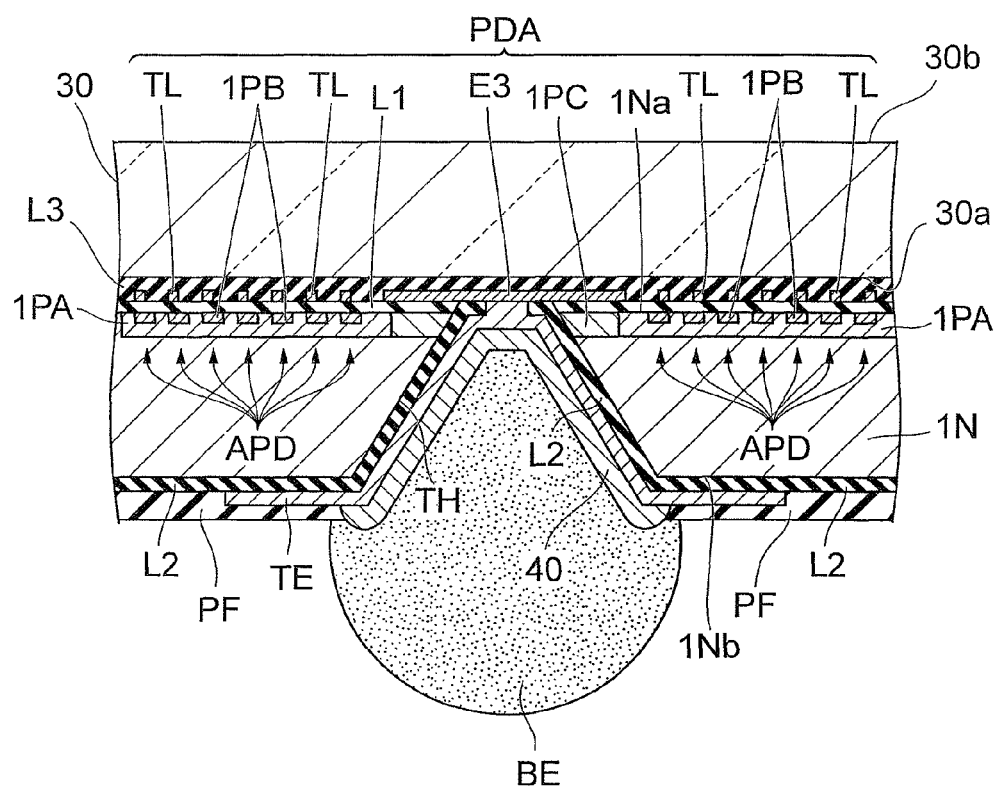
FIG. 16 is a drawing for explaining the manufacturing process of the light detection device according to the present embodiment.

Next, the glass substrate 30 is bonded to the semiconductor light detection element 10 through an optical adhesive (cf. FIG. 16). This process results in optically connecting the glass substrate 30 and the semiconductor light detection element 10 to each other. The glass substrate 30 is also prepared in the form of a glass substrate preform including a plurality of glass substrates 30 as the semiconductor substrate 1N is. The process to bond the glass substrate 30 and the semiconductor light detection element 10 may be carried out after the formation of the insulating layer L3 on the semiconductor substrate 1N.

Next, a laminate body consisting of the glass substrates 30 (glass substrate preform) and the semiconductor light detection elements 10 (semiconductor wafer) is cut by dicing. This makes the side surfaces 1Nc of the semiconductor substrate 1N and the side surfaces 30c of the glass substrate 30 flush with each other.

Figure 17:
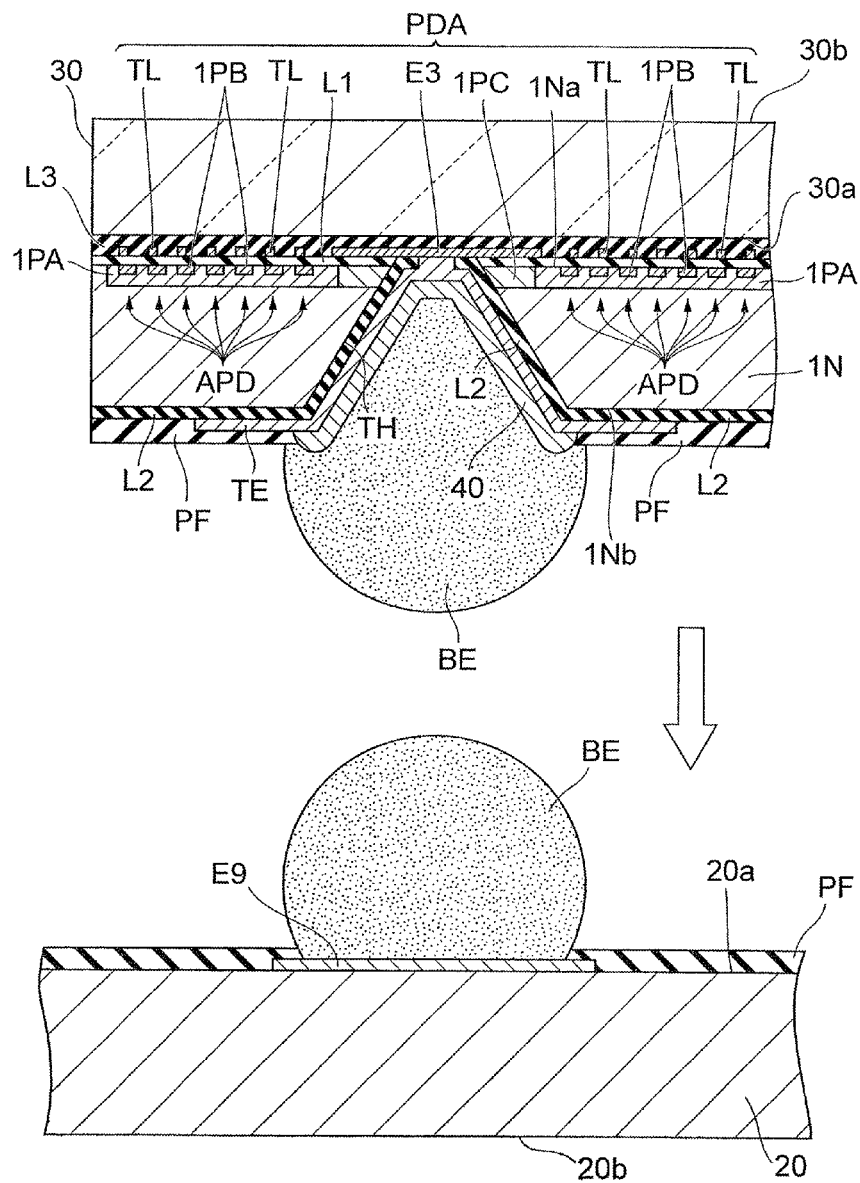
FIG. 17 is a drawing for explaining the manufacturing process of the light detection device according to the present embodiment.

Next, the semiconductor light detection element 10 with the glass substrate 30 arranged as opposed thereto and the mounting substrate 20 prepared separately are bump-connected to each other (cf. FIG. 17). The light detection device 1 is obtained through these processes. In the mounting substrate 20, the bump electrodes BE are formed at the positions corresponding to the electrodes E9 on the principal surface 20a side.

In the present embodiment, as described above, the semiconductor light detection element 10 has the plurality of channels each of which consists of the photodiode array PDA, thus realizing the light detection device 1 constructed in a larger area.

In the light detection device 1, the through-hole electrodes TE electrically connected to the signal lines TL and penetrating from the principal surface 1Na side to the principal surface 1Nb side are formed for the respective channels in the semiconductor substrate 1N of the semiconductor light detection element 10 and the through-hole electrodes TE of the semiconductor light detection element 10 and the electrodes E9 of the mounting substrate 20 are electrically connected through the bump electrodes BE. This configuration allows the distances of the interconnections for guiding signals from the respective channels to be set extremely short and allows values thereof to be equalized without significant variation. Therefore, it remarkably suppresses the influence of resistances and capacitances of the interconnections and thus achieves improvement in temporal resolution.

The light detection device 1 has the glass substrate 30 arranged on the principal surface 1Na side of the semiconductor substrate 1N. This configuration causes the glass substrate 30 to enhance the mechanical strength of the semiconductor substrate 1N. The side surfaces 1Nc of the semiconductor substrate 1N and the side surfaces 30c of the glass substrate 30 are flush with each other. This configuration reduces dead space.

The principal surface 30b of the glass substrate 30 is flat. This configuration makes it extremely easy to perform the installation of the scintillator onto the glass substrate 30.

The through-hole electrodes TE are located in the central regions of the respective channels. This configuration allows the interconnection distances from the respective avalanche photodiodes APD to the through-hole electrode TE to be set short in each channel.

The semiconductor light detection element 10 includes the electrodes E3 arranged on the principal surface 1Na side of the semiconductor substrate 1N and connecting the signal lines TL and the through-hole electrodes TE. This configuration allows the signal lines TL and the through-hole electrodes TE to be electrically connected with certainty.

The above described the preferred embodiment of the present invention, and it should be noted that the present invention is by no means limited to the aforementioned embodiment and can be modified in many ways without departing from the scope and spirit of the invention.

Figure 18:
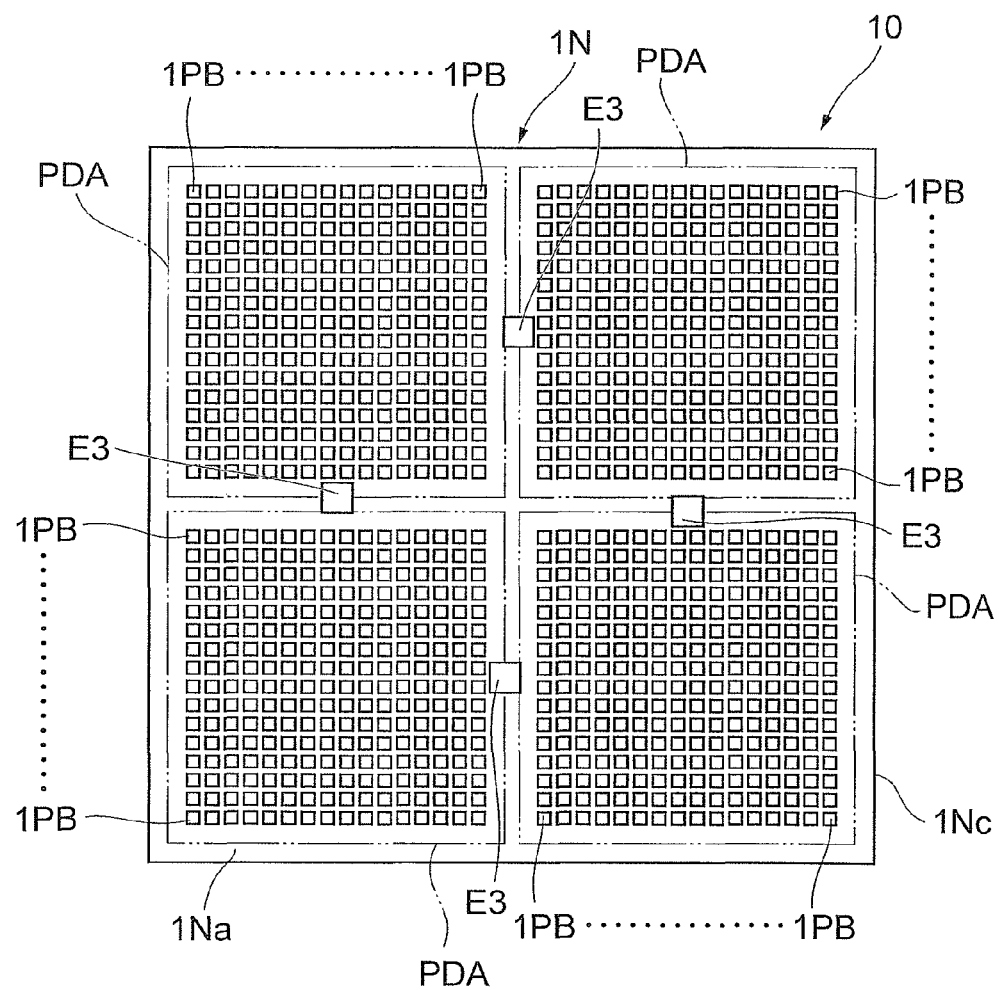
FIG. 18 is a schematic plan view of a semiconductor light detection element.
Figure 19:
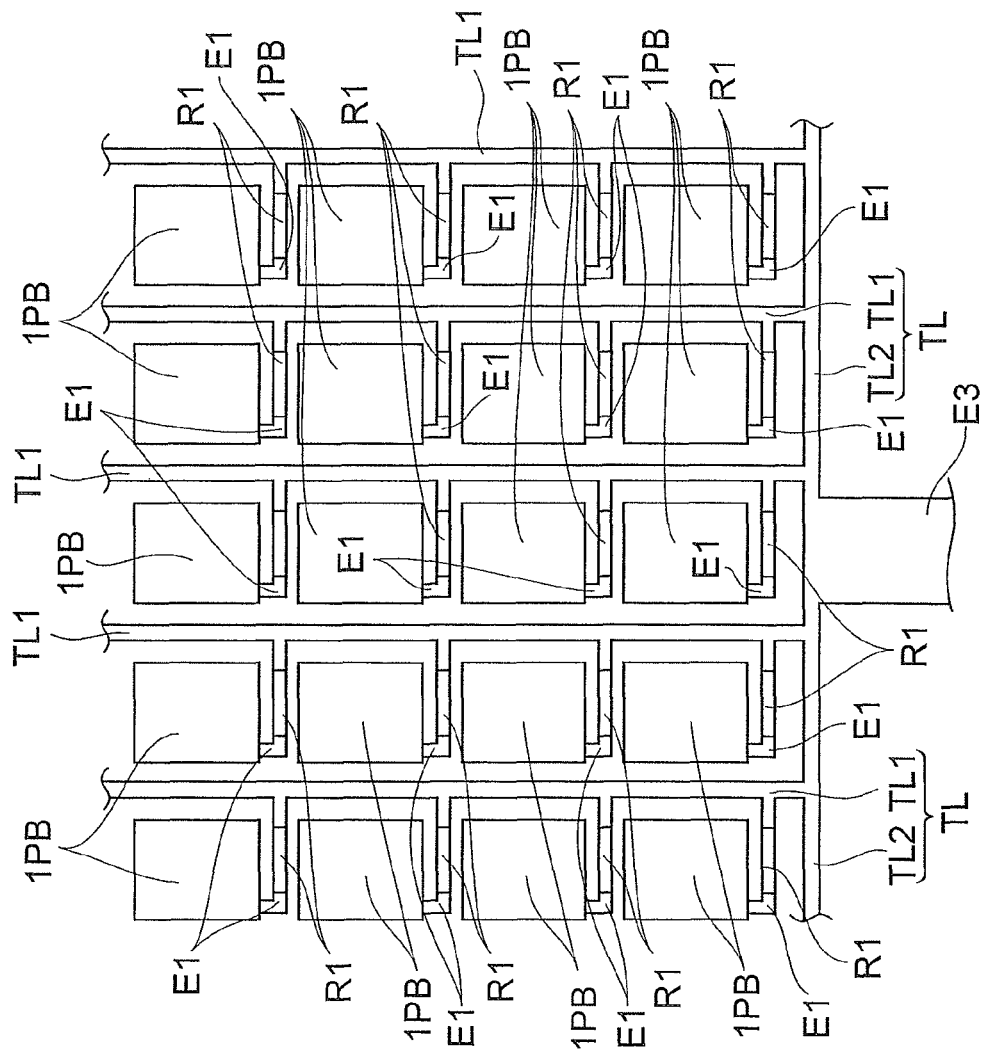
FIG. 19 is a schematic plan view of a photodiode array.

The through-hole electrodes TE may be located in regions between the channels (photodiode arrays PDA), as shown in FIGS. 18 and 19. In this case, it is feasible to prevent reduction in fill factor in each channel. FIGS. 18 and 19 are drawn without illustration of the insulating layer L1 shown in FIG. 2, for clarity of structure.

Figure 20:
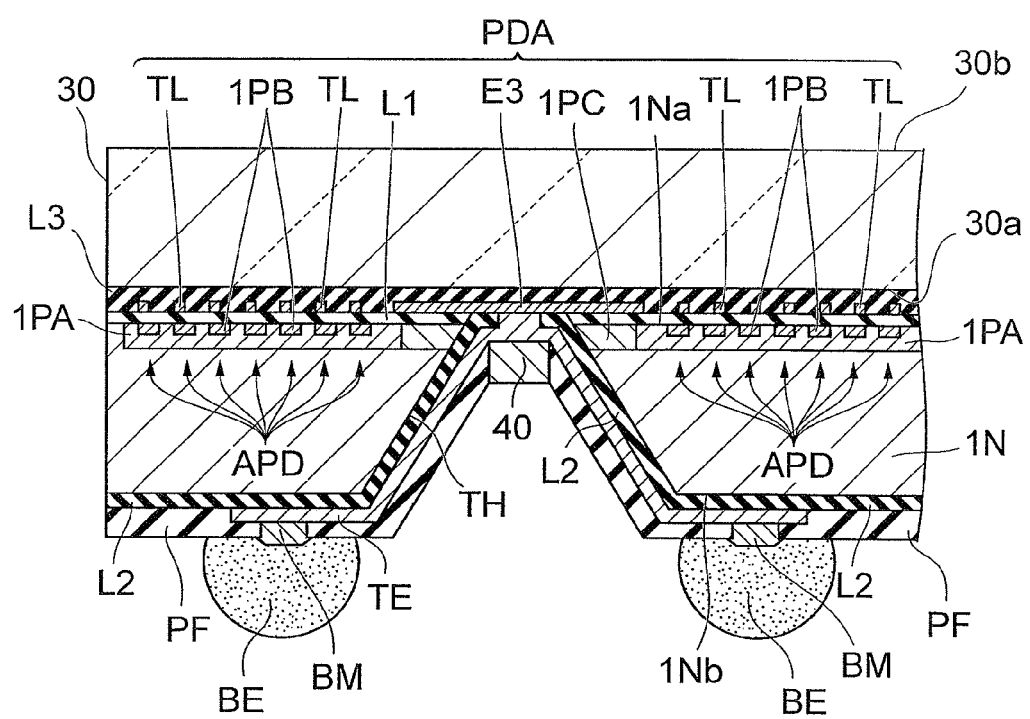
FIG. 20 is a drawing for explaining a sectional configuration of a light detection device according to a modification example of the present embodiment.
Figure 21:
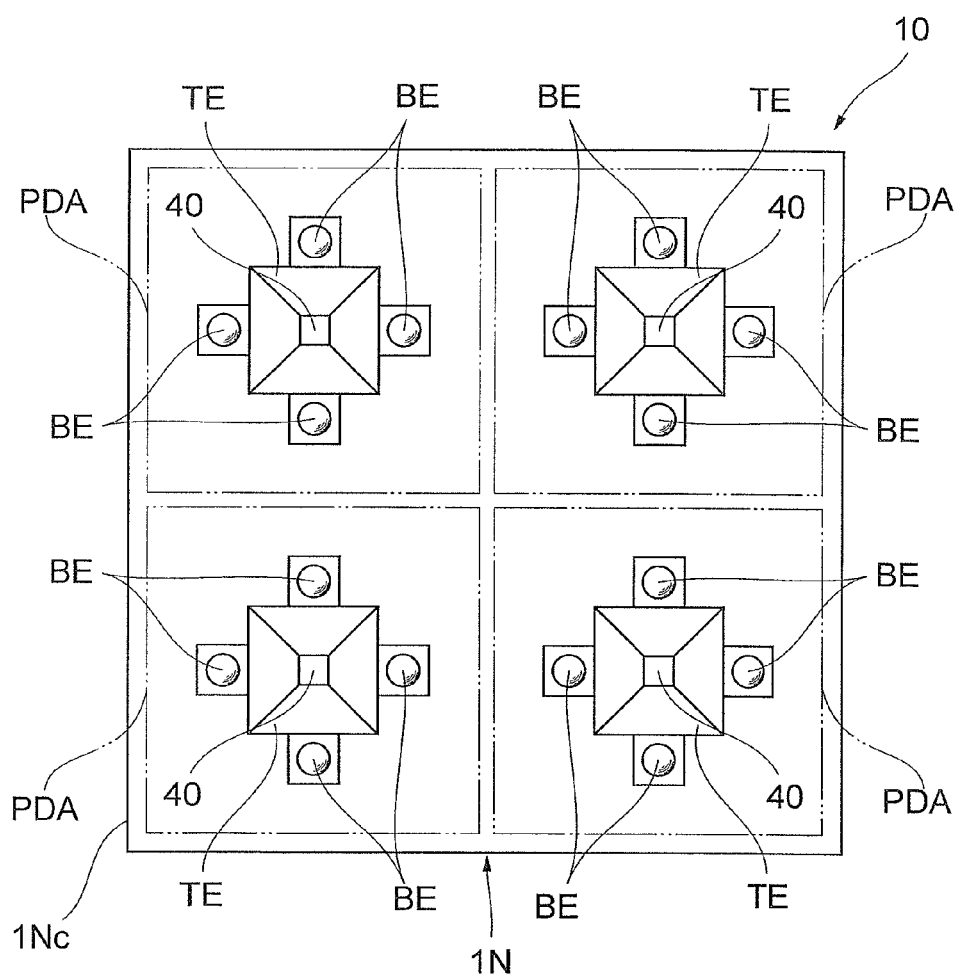
FIG. 21 is a schematic plan view of a semiconductor light detection element.

The bump electrodes BE may be arranged outside the through holes TH, as shown in FIGS. 20 and 21. In the example shown in FIGS. 20 and 21, a plurality of bump electrodes (four bump electrodes in the present example) BE are formed for one through-hole electrode TE. The bump electrodes BE are arranged on electrode portions being continuous to the through-hole electrode TE and arranged on the principal surface 1Nb side of the semiconductor substrate 1N. FIG. 21 is drawn without illustration of the passivation film PF shown in FIG. 2, for clarity of structure.

The shapes of the first and second semiconductor regions 1PA, 1PB do not have to be limited to the aforementioned shapes but may be other shapes (e.g., a circular shape or the like). The number (the number of rows and the number of columns) and arrangement of the avalanche photodiodes APD (second semiconductor regions 1PB) do not have to be limited to those described above. The number and arrangement of the channels do not have to be limited to those described above, either.

INDUSTRIAL APPLICABILITY

The present invention is applicable to the light detection devices for detecting weak light.

REFERENCE SIGNS LIST 1 light detection device; 1N semiconductor substrate; 1Na, 1Nb principal surfaces; 1Nc side surface; 1PA first semiconductor region; 1PB second semiconductor region; 10 semiconductor light detection element; 20 mounting substrate; 20a, 20b principal surfaces; 30 glass substrate; 30a, 30b principal surfaces; 30c side surface; APD avalanche photodiode; BE bump electrode; E1, E3, E9 electrodes; PDA photodiode array; R1 quenching resistor; SP signal processing unit; TE through-hole electrode; TL signal line.

The invention claimed is:

1. A light detection device comprising:
a semiconductor light detection element having a semiconductor substrate including first and second principal surfaces opposed to each other; and
a mounting substrate disposed as opposed to the semiconductor light detection element and having a third principal surface opposed to the second principal surface of the semiconductor substrate and a fourth principal surface opposed to the third principal surface,
wherein the semiconductor light detection element has a photodiode array, the photodiode array including a plurality of avalanche photodiodes operating in Geiger mode and formed in the semiconductor substrate, quenching resistors connected in series to the respective avalanche photodiodes and disposed on the first principal surface side of the semiconductor substrate, and signal lines to which the quenching resistors are connected in parallel and which are disposed on the first principal surface side of the semiconductor substrate, wherein the mounting substrate is provided with a first electrode disposed on the third principal surface side, wherein the semiconductor substrate is provided with a through-hole electrode electrically connected to the signal lines and penetrating from the first principal surface side to the second principal surface side, and wherein the through-hole electrode and the first electrode are electrically connected through a bump electrode, the quenching resistors are electrically connected to the first electrode through the signal lines, the through-hole electrode, and the bump electrode.

2. The light detection device according to claim 1, wherein a scintillator is optically connected to the first principal surface of the semiconductor substrate.

3. The light detection device according to claim 1, further comprising:
a glass substrate disposed on the first principal surface side of the semiconductor substrate and having a fifth principal surface opposed to the first principal surface of the semiconductor substrate and a sixth principal surface opposed to the fifth principal surface, wherein a side surface of the semiconductor substrate and a side surface of the glass substrate are flush with each other.

4. The light detection device according to claim 3, wherein the sixth principal surface of the glass substrate is flat.

5. The light detection device according to claim 1, wherein the through-hole electrode is located in a central region of the photodiode array.

6. The light detection device according to claim 1, wherein the semiconductor light detection element has a plurality of said photodiode arrays, and
the through-hole electrode is located in a region between the photodiode arrays.

7. The light detection device according to claim 1, wherein the semiconductor light detection element further includes a second electrode disposed on the first principal surface side of the semiconductor substrate and connecting the signal lines and the through-hole electrode.

8. The light detection device according to claim 1, further comprising:
a signal processing unit electrically connected to the first electrode and configured to process output signals from the photodiode array, the signal processing unit disposed on the mounting substrate.

* * * * *